(12) United States Patent
Kowalsky et al.

(10) Patent No.: US 11,791,423 B2
(45) Date of Patent: Oct. 17, 2023

(54) STACKED III-V SEMICONDUCTOR DIODE

(71) Applicant: 3-5 Power Electronics GmbH, Dresden (DE)

(72) Inventors: Jens Kowalsky, Storkow (DE); Riteshkumar Bhojani, Chemnitz (DE); Volker Dudek, Ettlingen (DE)

(73) Assignee: 3-5 Power Electronics GmbH, Dresden (DE)

(*) Notice: Subject to any disclaimer, the term of this patent is extended or adjusted under 35 U.S.C. 154(b) by 66 days.

(21) Appl. No.: 17/667,274

(22) Filed: Feb. 8, 2022

(65) Prior Publication Data

US 2022/0254938 A1 Aug. 11, 2022

(30) Foreign Application Priority Data

Feb. 8, 2021 (DE) ..................... 10 2021 000 611.9

(51) Int. Cl.
*H01L 29/861* (2006.01)
*H01L 29/20* (2006.01)
*H01L 29/36* (2006.01)

(52) U.S. Cl.
CPC .......... *H01L 29/8618* (2013.01); *H01L 29/20* (2013.01); *H01L 29/36* (2013.01)

(58) Field of Classification Search
CPC ...... H01L 29/8618; H01L 29/20; H01L 29/36
See application file for complete search history.

(56) References Cited

U.S. PATENT DOCUMENTS 10,074,540 B2 9/2018 Dudek
10,186,587 B2 1/2019 Kuenle et al.
(Continued)

FOREIGN PATENT DOCUMENTS

CN 103178120 A 6/2013
CN 108242472 A * 7/2018
(Continued)

OTHER PUBLICATIONS

German Ashkinazi: "GaAs Power Devices" ISBN 965-7094-19-4, 1999, pp. 8-9.
(Continued)

*Primary Examiner* — Syed I Gheyas
(74) *Attorney, Agent, or Firm* — Muncy, Geissler, Olds & Lowe, P.C.

(57) ABSTRACT

A semiconductor having a n-doped cathode layer, a p-doped anode layer, and a drift region, arranged between the cathode layer and the anode layer, with a dopant concentration of at most $8 \cdot 10^{15}$ cm$^{-3}$. The drift region has a lightly n-doped drift layer and a lightly p-doped drift layer, arranged between the n-doped drift layer and the anode layer, both drift layers each have a layer thickness of at least 5 μm. The cathode layer has a first section with a dopant concentration of at least $1 \cdot 10^{17}$ cm$^{-3}$ and a second section, arranged between the first section and the drift region, the second section has a layer thickness of at least 1 μm and a dopant concentration gradient that increases in the direction of the first section up to a dopant concentration maximum. The dopant concentration maximum is smaller or equal to the dopant concentration of the first section.

13 Claims, 2 Drawing Sheets

(56) References Cited

U.S. PATENT DOCUMENTS

| | | | |
|---|---|---|---|
| 10,263,124 | B2 | 4/2019 | Dudek |
| 10,529,809 | B2 | 1/2020 | Kuenle et al. |
| 10,854,760 | B2 | 12/2020 | Dudek |
| 2019/0198621 | A1 | 6/2019 | Lutz et al. |

FOREIGN PATENT DOCUMENTS

| | | |
|---|---|---|
| DE | 102011006675 A1 | 10/2012 |
| DE | 102016111844 A1 | 12/2017 |
| DE | 102018000395 A1 | 7/2019 |
| EP | 0 614 231 A2 | 9/1994 |
| EP | 3321971 B1 | 10/2019 |
| EP | 3321970 B1 | 2/2020 |
| JP | 2019125788 A | 7/2019 |
| WO | WO2011/024214 A | 3/2011 |

OTHER PUBLICATIONS

Koel et al., "Characterization of the temperature dependent behavior of snappy phenomenon by the switching-off of GaAs power diode structures," Adv Comp Methods & Experiments in Heat Transfer XI, vol. 1, pp. 439-449, XP055545469 (Jul. 1, 2014).

Soldatenkov et al., "GaAs-A:B5 heterostructures for high-speed power diodes manufacturing," J. of Phys, Conf Series, 17$^{th}$ Russian Youth Conf on Phys & Astronomy, vol. 661, No. 1, pp. 1-6 XP20290808 (Dec. 2, 2015).

Foompuu et al., "Investigation of p-i-n GaAs Structures by DLTS Method," Microelectronics, 2010 No. 4, pp. 51-54, XP055897724, found at https://www.researchgate.net/publication/267372152_Investigation_of_p-i-n_GaAs_structures_by_DLTS_method, (Apr. 1, 2010).

Toompuu et al., "GaAs Based Diffusion Welded High Voltage Diode Stacks," 2010 IEEE Intl Conf on Semiconductor Electronics (ICSE), XP032733516, pp. 1-4 (Jun. 28, 2010).

\* cited by examiner

STACKED III-V SEMICONDUCTOR DIODE

This nonprovisional application claims priority under 35 U.S.C. § 119(a) to German Patent Application No. 10 2021 000 611.9, which was filed in Germany on Feb. 8, 2021, and which is herein incorporated by reference.

BACKGROUND OF THE INVENTION

Field of the Invention

The present invention relates to a stacked III-V semiconductor diode comprising or consisting of GaAs with a heavily n-doped cathode layer, a heavily p-doped anode layer, and a drift region arranged between the cathode layer and the anode layer.

Description of the Background Art

A high-voltage-resistant semiconductor diode with a $p^+$-n-$n^+$ structure made of gallium arsenide is known from "GaAs Power Devices" by German Ashkinazi, ISBN 965-7094-19-4, pages 8 and 9.

Additional stacked III-V semiconductor diodes are known from EP 3 321 971 B1, which corresponds to US 2018/0138320, and from EP 3 321 970 B1, which corresponds to US 2018/138043, which are all herein incorporated by reference, and wherein the semiconductor diodes have an additional intermediate layer between the drift region and the cathode or anode.

SUMMARY OF THE INVENTION

It is therefore an object of the present invention to provide a device that refines the state of the art.

In an exemplary embodiment of the invention, a stacked III-V semiconductor diode comprising or consisting of GaAs is provided, having a heavily n-doped cathode layer, a heavily p-doped anode layer, and a drift region, arranged between the cathode layer and the anode layer, with a dopant concentration of at most $8 \cdot 10^{15}$ cm$^{-3}$.

The drift region has a lightly n-doped drift layer and a lightly p-doped drift layer, arranged between the n-doped drift layer and the anode layer, wherein both drift layers each have a layer thickness of at least 5 µm.

The cathode layer can have a first section with a constant or at least substantially constant dopant concentration of at least $1 \cdot 10^{17}$ cm$^{-3}$ or at least $1 \cdot 10^{18}$ cm$^{-3}$ and a second section, arranged between the first section and the drift region.

The second section can have a layer thickness of at least 1 µm and a dopant concentration gradient that increases in the direction of the first section up to a dopant concentration maximum.

The dopant concentration maximum of the second section is less than or equal to the dopant concentration of the first section.

It is understood that all semiconductor layers of a semiconductor diode that consists of GaAs or comprises GaAs, therefore, in particular the cathode layer, the anode layer, and the drift region, each consist of GaAs or at least comprise GaAs. Stated differently, each semiconductor layer of the III-V semiconductor diode has at least the elements Ga and As.

The semiconductor layers can be produced by means of epitaxy. In a refinement, the cathode layer or the anode layer can be formed by a substrate layer. Further III-V semiconductor layers are preferably grown epitaxially on the substrate layer in order to form the III-V semiconductor diode.

Alternatively, the III-V semiconductor diode comprises at least one semiconductor bond. Here, surfaces of two GaAs semiconductor disks or GaAs wafers are joined together.

The doping of the respective GaAs semiconductor layers can be introduced during the epitaxy. The epitaxy is preferably carried out via MOVPE and/or LPE.

The doping via ion implantation can be carried out additionally after the epitaxial growth or, alternatively, instead of introduction during the epitaxy.

In addition, it is understood that the semiconductor diode can have further layers made of other materials, in particular metallic terminal contact layers. The terminal contact layers consist, for example, completely or partially of a metal, e.g., gold, or of a metal alloy and are produced, for example, by means of electron beam evaporation or by means of sputtering.

The cathode layer region and the anode layer region adjacent to a terminal contact layer can have a high dopant concentration in order to form a contact with the lowest possible resistance and to keep the series resistance or power dissipation of the semiconductor diode as low as possible.

The drift region is characterized by a total width of at least 10 µm and by a division into two regions or layers with different low doping levels.

The overall width can be at least 20 µm or at least 40 µm or at least 60 µm. The total width is divided into a weakly p-doped and a weakly n-doped region or layer.

The PN junction thus forms within the drift region and in a region with very low dopant concentrations.

The transition between the drift region and the high dopant concentration level of the first section of the cathode can be formed by means of the second cathode section with a dopant concentration gradient increasing in the direction of the second cathode section.

Due to the stepwise increase in the dopant concentration in the transition region over one, two, or even more steps, it is possible to produce diodes with a significantly improved turn-off behavior. Fluctuations in the current-voltage characteristic are minimized when the diode is switched off.

A further advantage is that diodes with particularly high reverse voltages of over 1100 V or even over 1200 V, with small on-state resistances, and particularly low capacitances per area can be realized.

Isoelectric or isovalent centers can be incorporated into the p-doped drift layer and/or the anode layer in order to increase the switching speed, i.e., the change between the reverse and forward direction.

In particular, diodes with a reverse recovery charge of a maximum of 800 nC can be produced.

The anode layer can have a first section with a dopant concentration of at least $1 \cdot 10^{17}$ cm$^{-3}$ and a second section, arranged between the first section and the drift region.

The second section has a layer thickness of at least 1 µm and a dopant concentration gradient that increases in the direction of the first section up to a dopant concentration maximum.

The dopant concentration maximum of the second section is less than or equal to the dopant concentration of the first section.

By means of the second layer section of the anode layer, the transition of the dopant concentration between the drift region and the further anode layer is formed to increase stepwise or continuously.

In an example, the layer thickness of the second section of the cathode layer and/or the anode layer can be at most 7

µm or at most 5 µm or at most 3 µm. A small layer thickness is sufficient, for example, to improve the turn-off behavior of the diode without unnecessarily increasing the series resistance.

In another example, the dopant concentration gradient of the second section of the cathode layer and/or the anode layer is formed concave or convex or linear.

The dopant concentration gradient of the second section of the cathode layer and/or the anode layer can have one step or a plurality of steps, wherein in alternative refinements, one step or a plurality of steps or each step of the dopant concentration gradient has a convex flank or a concave flank or a linear flank.

In an example, each step has a depth of at least 0.2 µm or of at least 0.5 µm.

The dopant concentration can change from step to step by at least a factor of 5 or at least a factor of 10.

The dopant concentration of the first section of the cathode layer can be at least $8 \cdot 10^{18}$ cm$^{-3}$ or at least $10 \cdot 10^{19}$ cm$^{-3}$.

The anode layer can have a third section, wherein the third section can be arranged on a side of the first section that faces away from the second section, and has a dopant concentration of at least $5 \cdot 10^{18}$ cm$^{-3}$ or at least $10 \cdot 10^{19}$ cm$^{-3}$.

By dividing the anode layer into two sublayers, it is possible to keep the ohmic resistance to the terminal contact as low as possible by means of high doping and at the same time to realize a potential gradient between the cathode layer and the anode layer by means of a slightly lower doping adjacent to the drift region and to improve further the turn-off behavior.

The cathode layer and/or the anode layer can have a layer thickness of at least 2 µm or at least 5 µm or at least 20 µm.

The cathode layer or the anode layer can be formed as a substrate.

In one refinement, the respective dopant concentration gradient in the drift layers is formed either concave or convex or linear or step-shaped.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
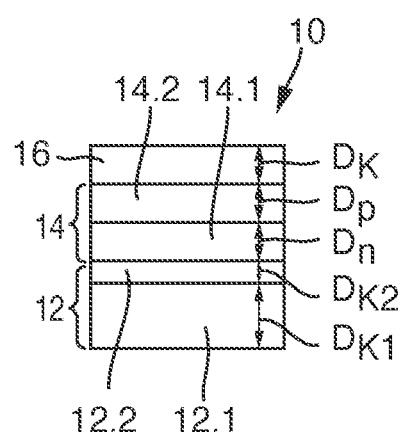
FIG. 1 is a view of an example of a stacked III-V semiconductor diode.

The illustration in FIG. 1 shows an example of a stacked III-V semiconductor diode 10 comprising GaAs or consisting of GaAs. Semiconductor diode 10 has a cathode layer 12, a drift region 14, and an anode layer 16 with a layer thickness DA in the order mentioned.

Cathode layer 12 has a first section 12.1 formed from a heavily n-doped substrate layer with a layer thickness $D_{K1}$ from 50 µm to 250 µm and a constant or at least substantially constant dopant concentration of at least $1 \cdot 10^{18}$ cm$^{-3}$, preferably of at least $8 \cdot 10^{18}$ cm$^{-3}$.

In addition, cathode layer 12 has a second section 12.2, which is arranged between first section 12.1 and drift region 14, with a significantly lower layer thickness $D_{K2}$ of at least 1 µm. The dopant concentration of an n-dopant of second section 12.2 increases in the direction of first section 12.1 up to a dopant concentration maximum, wherein the dopant concentration maximum is less than the dopant concentration of first section 12.1.

Drift region 14 divides into a weakly n-doped drift layer 14.1, adjacent to the cathode layer 12 and having a layer thickness $D_n$, and a weakly p-doped drift layer 14.2 with a layer thickness $D_p$ arranged between the n-doped drift layer 14.1 and anode layer 16.

The layer thickness $D_n$ of the n-doped drift layer 14.1 is at least 5 µm, preferably at least 40 µm. A dopant concentration decreases from a dopant concentration maximum of at most $8 \cdot 10^{15}$ cm$^{-3}$, preferably of at most $2 \cdot 10^{15}$ cm$^{-3}$, in the direction of the p-doped drift layer 14.2.

The layer thickness $D_p$ of the p-doped drift layer 14.2 is at least 5 µm, preferably at least 20 µm. The layer thickness $D_p$ of the p-doped drift layer 14.2 constitutes half or a third of the layer thickness $D_n$ of the n-doped drift layer 14.1. A dopant concentration of the p-doped drift layer 14.2 increases in the direction of anode layer 16 up to a dopant concentration maximum of at least $1 \cdot 10^{17}$ cm$^{-3}$ or at least $1 \cdot 10^{18}$ cm$^{-3}$.

Starting from the substrate forming first section 12.1 of cathode layer 12, the further layers are preferably produced epitaxially.

Figure 2:
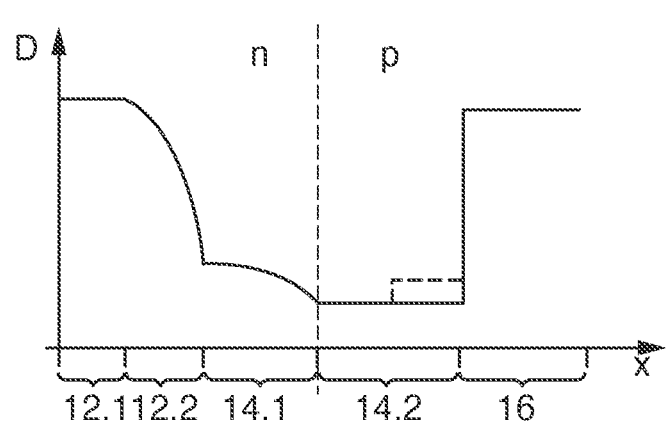
FIG. 2 is a view of an example of a dopant concentration gradient along the III-V layer stack of the semiconductor diode.

The illustration in FIG. 2 shows a first embodiment of the dopant concentration gradient along the stacked III-V semiconductor diode 10 in FIG. 1.

The dopant concentration gradient D is shown versus a position x along the stack of semiconductor diode 10.

Starting from a high and constant n-doping along first section 12.1 of cathode layer 12, the dopant concentration of the n-dopants decreases along second section 12.2 and along n-drift layer 14.1. The decrease is formed convex in each case and takes place considerably more slowly in the region of n-drift layer 14.1 than in the area of second section 12.2 of cathode layer 12.

The PN junction forms between the n-doped drift layer 14.1 and the p-doped drift layer 14.2. In the exemplary embodiment shown, the p-doped drift layer 14.2 has a constant or step-shaped, very low dopant concentration of p-dopants. The subsequent anode layer has a constant and very high dopant concentration of p-dopants.

Figure 3:
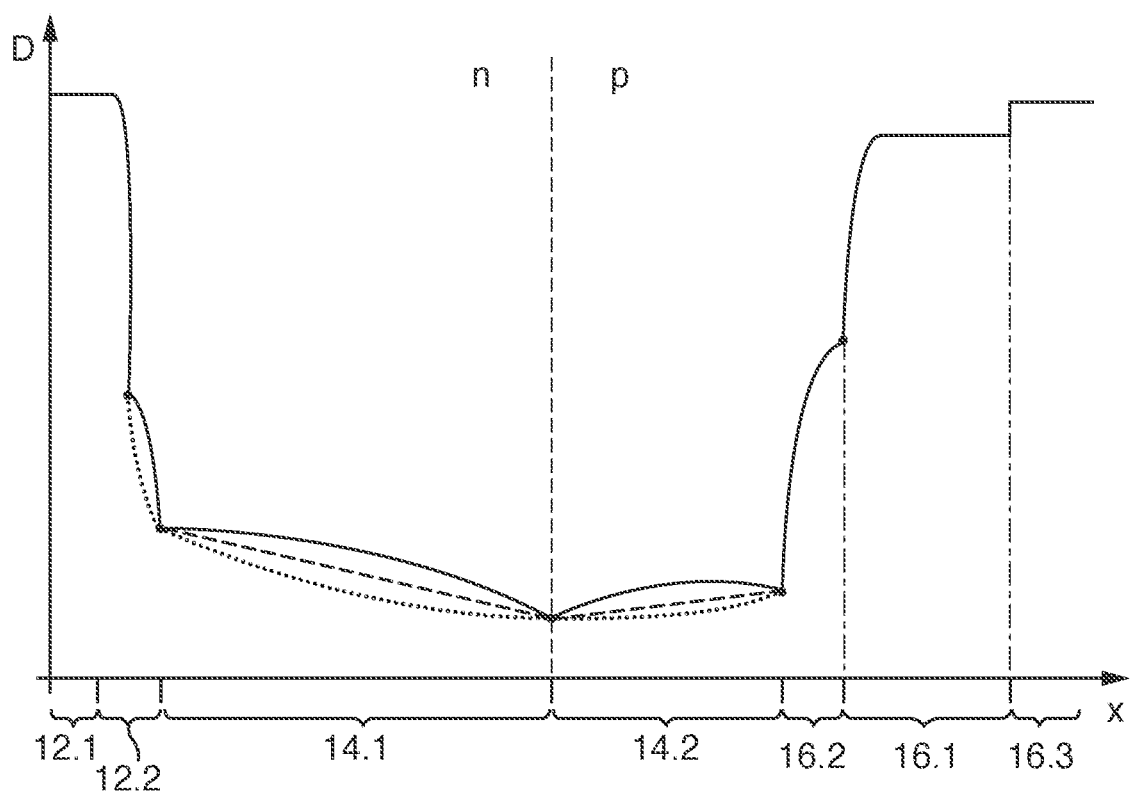
FIG. 3 is a view of an example of a dopant concentration gradient along the III-V layer stack of the semiconductor diode.

In the diagram in FIG. 3, a further embodiment of III-V semiconductor diode 10 is shown using the dopant concentration gradient. Only the differences from FIG. 2 will be described below.

The drop in the dopant concentration of second section 12.2 of cathode layer 12 has two steps, each with a convex flank.

The dopant concentration gradient of the n-doped drift layer 14.1 increases in the direction of cathode layer 12 in a convex or linear or concave manner. The dopant concentration gradient of the p-doped drift layer 14.2 also increases in the direction of anode layer 16 in a convex or linear or concave manner.

In addition, the anode layer has a first section 16.1 with a first constant dopant concentration, a second section 16.2, arranged between first section 16.1 and drift region 14, with a dopant concentration gradient increasing over two steps in the direction of the first section 16.1, and a third section 16.3. Third section 16.3 is arranged on the side of first section 16.1 that faces away from second section 16.2 and has a constant dopant concentration, wherein the dopant concentration of third section 16.3 is higher than the dopant concentration of first section 16.1.

Figure 4:
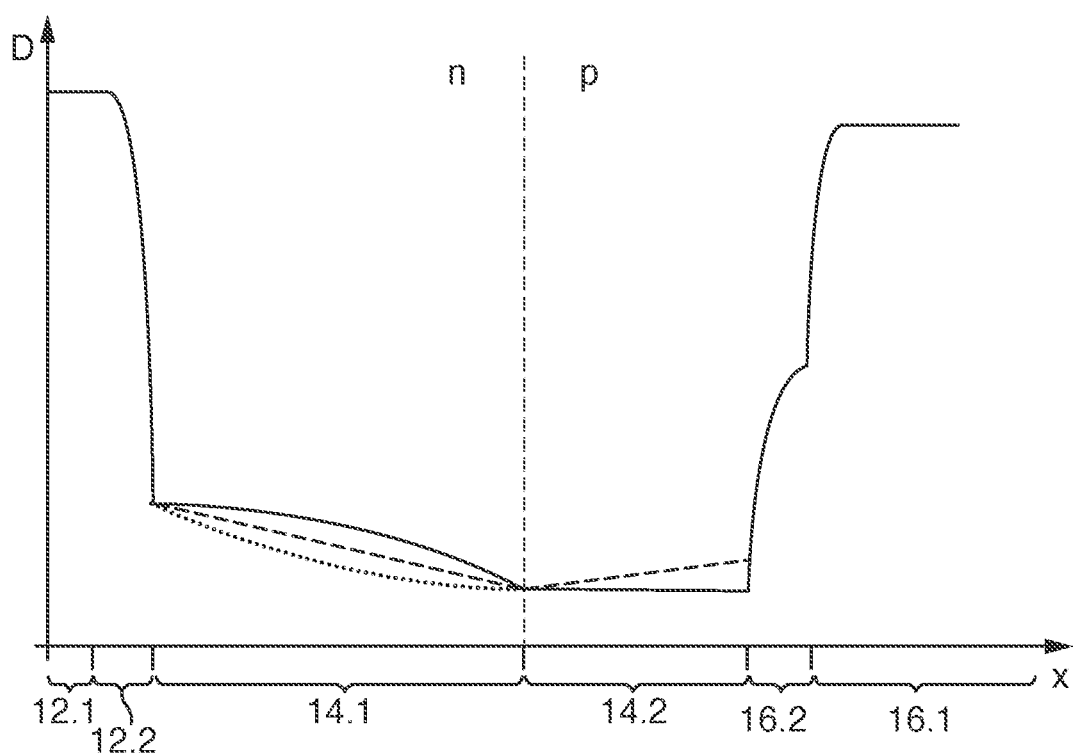
FIG. 4 is a view of an example of a dopant concentration gradient along the III-V layer stack of the semiconductor diode.

In the diagram in FIG. 4, a further embodiment of III-V semiconductor diode 10 is shown using the dopant concentration gradient. Only the differences from FIG. 3 will be described below.

In the embodiment shown, only second section 16.2 of anode layer 16 has a stepped gradient, whereas the increase in the dopant concentration of second section 12.2 of cathode layer 12 is convex.

Figure 5:
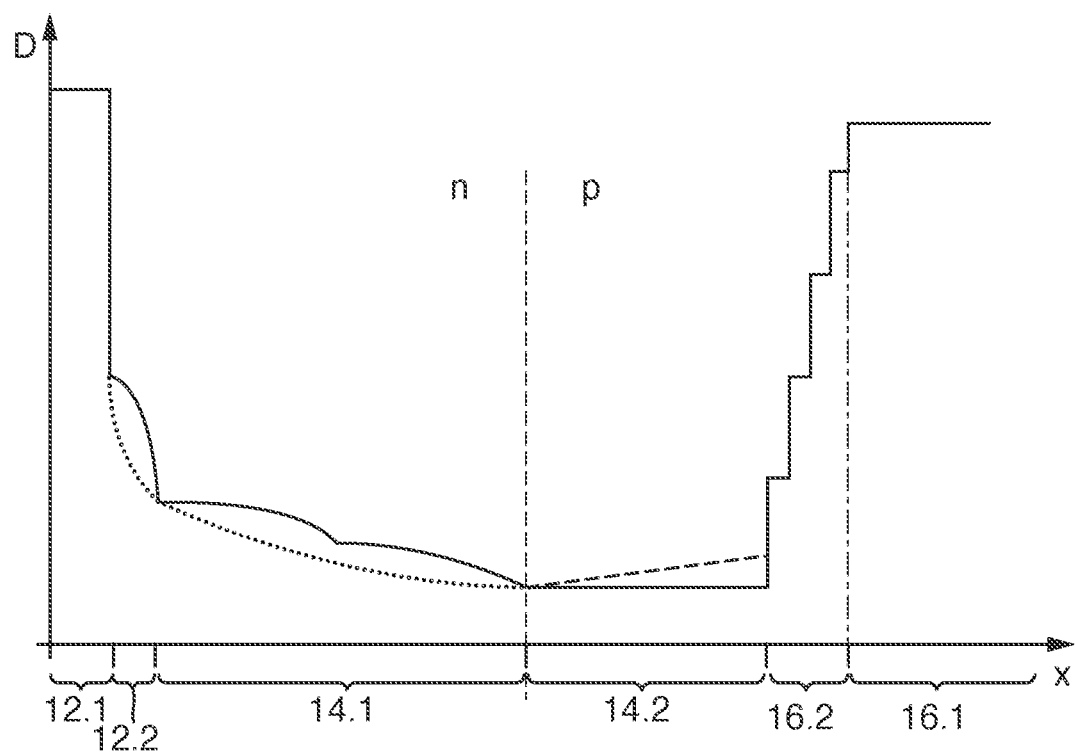
FIG. 5 is a view of an example of a dopant concentration gradient along the III-V layer stack of the semiconductor diode.

In the diagram in FIG. 5, a further embodiment of III-V semiconductor diode 10 is shown using the dopant concentration gradient. Only the differences from FIG. 4 will be described below.

The dopant concentration gradient of second section 12.2 of cathode layer 12 increases up to a dopant concentration maximum, wherein the dopant concentration maximum is considerably lower than the dopant concentration of first section 12.1, so that a dopant concentration jump is formed between first section 12.1 and second section 12.2.

In one embodiment shown, the dopant concentration gradient has two steps, each with a convex flank, along the n-doped drift layer.

Along second section 16.2 of anode layer 16, the dopant concentration increases over a number of steps, each with a linear flank, in particular over rectangular steps. In the exemplary embodiment shown, cathode layer 16 does not have a third section 16.3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked semiconductor diode comprising or consisting of GaAs, and comprising:
    a heavily n-doped cathode layer;
    a heavily p-doped anode layer; and
    a drift region arranged between the cathode layer and the anode layer with a dopant concentration of at most $8 \cdot 10^{15}$ cm$^{-3}$,
    wherein the drift region has a lightly n-doped drift layer and a lightly p-doped drift layer arranged between the n-doped drift layer and the anode layer,
    wherein both drift layers each have a layer thickness of at least 5 μm,
    wherein the cathode layer has a first section with a constant or at least substantially constant dopant concentration of at least $1 \cdot 10^{17}$ cm$^{-3}$ or at least $1 \cdot 10^{18}$ cm$^{-3}$ and a second section arranged between the first section and the drift region,
    wherein the second section has a layer thickness of at least 1 μm and a dopant concentration gradient that increases in the direction of the first section up to a dopant concentration maximum, and
    wherein the dopant concentration maximum is less than or equal to the dopant concentration of the first section.

2. The stacked semiconductor diode according to claim 1, wherein the anode layer has a first section with a dopant concentration of at least $1 \cdot 10^{17}$ cm$^{-3}$ and a second section arranged between the first section and the drift region, wherein the second section has a layer thickness of at least 1 μm and a dopant concentration gradient that increases in the direction of the first section up to a dopant concentration maximum and the dopant concentration maximum is less than or equal to the dopant concentration of the first section.

3. The stacked semiconductor diode according to claim 1, wherein the layer thickness of the second section is at most 7 μm or at most 5 μm or at most 3 μm.

4. The stacked semiconductor diode according to claim 1, wherein the dopant concentration gradient of the second section is formed concave or convex or linear.

5. The stacked semiconductor diode according to claim 1, wherein the respective dopant concentration gradient in the drift layers is formed concave or convex or linear or step-shaped.

6. The stacked semiconductor diode according to claim 1, wherein the dopant concentration gradient of the second section has one step or a plurality of steps.

7. The stacked semiconductor diode according to claim 6, wherein one step or a plurality of steps or each step of the dopant concentration gradient has a convex flank or a concave flank or a linear flank.

8. The stacked semiconductor diode according to claim 6, wherein each step has a depth of at least 0.2 μm or of at least 0.5 μm.

9. The stacked semiconductor diode according to claim 6, wherein the dopant concentration changes from step to step by at least a factor of 5 or at least a factor of 10.

10. The stacked semiconductor diode according to claim 1, wherein the dopant concentration of the first section of the cathode layer is at least $8 \cdot 10^{18}$ cm$^{-3}$ or at least $1 \cdot 10^{19}$ cm$^{-3}$.

11. The stacked semiconductor diode according to claim 1, wherein the anode layer has a third section, wherein the third section is arranged on a side of the first section that faces away from the second section, and has a dopant concentration of at least $5 \cdot 10^{18}$ cm$^{-3}$ or at least $1 \cdot 10^{19}$ cm$^{-3}$.

12. The stacked semiconductor diode according to claim 1, wherein the cathode layer and/or the anode layer have a layer thickness of at least 2 μm or at least 5 μm or at least 20 μm.

13. The stacked semiconductor diode according to claim 1, wherein the cathode layer or the anode layer is formed as a substrate.

* * * * *